United States Patent [19]

Wu et al.

[11] Patent Number: 5,470,668
[45] Date of Patent: Nov. 28, 1995

[54] METAL OXIDE FILMS ON METAL

[75] Inventors: Xin D. Wu; Prabhat Tiwari, both of Los Alamos, N.M.

[73] Assignee: The Regents of the University of Calif., Oakland, Calif.

[21] Appl. No.: 221,426

[22] Filed: Mar. 31, 1994

[51] Int. Cl.⁶ .................................................. B32B 09/00
[52] U.S. Cl. ........................ 428/688; 428/689; 428/701; 505/237; 505/239
[58] Field of Search ............................ 361/313; 428/688, 428/700, 701, 702, 209, 210, 689; 252/521

[56] References Cited

U.S. PATENT DOCUMENTS

3,616,446  10/1971  DeWitt .................................. 252/521
5,248,564   9/1993  Ramesh ................................ 428/688
5,270,298  12/1993  Ramesh ................................ 361/313

*Primary Examiner*—Patrick J. Ryan
*Assistant Examiner*—Patrick R. Jewick
*Attorney, Agent, or Firm*—Bruce H. Cottrell; William A. Eklund

[57] ABSTRACT

A structure including a thin film of a conductive alkaline earth metal oxide selected from the group consisting of strontium ruthenium trioxide, calcium ruthenium trioxide, barium ruthenium trioxide, lanthanum-strontium cobalt oxide or mixed alkaline earth ruthenium trioxides thereof upon a thin film of a noble metal such as platinum is provided.

4 Claims, 9 Drawing Sheets

METAL OXIDE FILMS ON METAL

FIELD OF THE INVENTION

The present invention relates to thin layers, especially epitaxial thin layers, of alkaline earth metal oxides upon a metal substrate such as platinum. This invention is the result of a contract with the Department of Energy (Contract No. W-7405-ENG-36).

BACKGROUND OF THE INVENTION

Conductive metal oxides have been found useful in many technological applications such as electrodes. The conductive metal oxides, $La_{0.5}Sr_{0.5}CoO_3$ (LSCO) and $SrRuO_3$ (SRO), have previously been formed as thin films on various substrates such as magnesium oxide (MgO), strontium titanate ($SrTiO_3$), and lanthanum aluminate ($LaAlO_3$).

It has now been found that conductive metal oxides such as LSCO and SRO can be formed upon noble metal films or substrates such as platinum.

It is an object of the present invention to provide a structure of a conductive metal oxide upon a noble metal.

It is a further object of the invention to provide a heteroepitaxial structure of a conductive metal oxide upon a noble metal.

SUMMARY OF THE INVENTION

To achieve the foregoing and other objects, and in accordance with the purposes of the present invention, as embodied and broadly described herein, the present invention provides a structure including a thin film of a conductive alkaline earth metal oxide selected from the group consisting of strontium ruthenium trioxide, calcium ruthenium trioxide, barium ruthenium trioxide, lanthanum-strontium cobalt oxide or mixed alkaline earth ruthenium trioxides thereof upon a thin film of a noble metal. In a preferred embodiment, the conductive alkaline earth metal oxide is strontium ruthenium trioxide.

The present invention further provides a heteroepitaxial oriented structure including a thin film of an epitaxial oriented conductive alkaline earth metal oxide selected from the group consisting of strontium ruthenium trioxide, calcium ruthenium trioxide, barium ruthenium trioxide, lanthanum-strontium cobalt oxide or mixed alkaline earth ruthenium trioxides thereof upon a thin film of a noble metal. In a preferred embodiment, the epitaxial oriented conductive alkaline earth metal oxide is strontium ruthenium trioxide.

DETAILED DESCRIPTION

The present invention is concerned with thin layers, especially epitaxial thin layers, of conductive alkaline earth metal oxides upon a metal substrate such as platinum. After such layers of conductive alkaline earth metal oxides are formed upon a metal substrate, the conductive alkaline earth metal/metal composite can have other oxide materials such as, e.g., lead zirconium titanate (PZT), lead lanthanum zirconium titanate (PLZT), potassium niobium tantalate, yttrium barium copper oxide (YBCO) and the like deposited upon the layer of conductive alkaline earth metal oxide. While oxide materials such as PZT can be deposited directly upon a metal layer such as platinum, the properties of such a PZT layer directly on platinum suffer from gradual degradation. The combination of the conductive alkaline earth metal oxide layer adjacent a thin metal film can be considered as a composite electrode structure or the conductive alkaline earth metal layer may be considered as a buffer or intermediate layer between the metal film or substrate and a subsequently deposited oxide material.

The conductive alkaline earth metal oxides can include strontium ruthenium oxide ($SrRuO_3$), calcium ruthenium oxide ($CaRuO_3$), barium ruthenium oxide ($BaRuO_3$), lanthanum-strontium cobalt oxide and mixed alkaline earth metal oxides such as, e.g., strontium calcium ruthenium oxide ($Sr_{1-x}Ca_xRuO_3$ where $0 \leq x \leq 1$) and strontium barium ruthenium oxide ($Sr_{1-x}Ba_xRuO_3$ where $0 \leq x \leq 1$). Such alkaline earth metal oxides generally have resistivities of about 10 to 20 times those of common metals such as copper.

The conductive alkaline earth metal oxides generally have high structural compatibility with the metal substrate. For example, $SrRuO_3$ has an orthorhombic structure and lattice constants of a=5.55A, b=5.56A and c=7.86A, and $La_{0.5}Sr_{0.5}CoO_3$ has a lattice constant of 3.835A. $La_{0.5}Sr_{0.5}CoO_3$ can be represented by $LaSrCo_2O_6$ with a unit cell consisting of two diagonally adjacent perovskite unit lattices under a slight rhombohedral distortion along the <111> axis. More importantly, the conductive alkaline earth metal oxides generally also have chemical compatibility with the metal substrate, i.e., no significant chemical reaction such as loss of oxygen from the conductive metal oxide to the metal occurs.

The thin films of conductive alkaline earth metal oxides are deposited directly upon metal substrates, generally thin noble metal films. The noble metals should be non-oxidizable at high temperatures, e.g., about 850° C., and under oxygen. Suitable noble metals include, e.g., platinum, silver, gold or alloys thereof. The thin films of the conductive alkaline earth metal oxides can generally be from about 100

Angstroms up to about 10,000 Angstroms or thicker in thickness depending upon the length of deposition time employed. The metal film serves to reduce the overall resistivity of the conductive alkaline earth metal oxide/metal composite or structure. The relative thickness of the thin metal film and the thin films of conductive alkaline earth metal oxides depends upon the targeted or desired resistivity of the composite structure.

The development of the present invention allows for the preparation of certain electronic junction devices. For example, an electrical contact for, e.g., a ferroelectric device, can be prepared using a layer of the conductive alkaline earth metal oxide upon a platinum layer. Then, a ferroelectric material such as lead zirconium titanate (PZT), barium titanium oxide or potassium niobium tantalate can be deposited upon the layer of conductive oxide.

Figure 1:
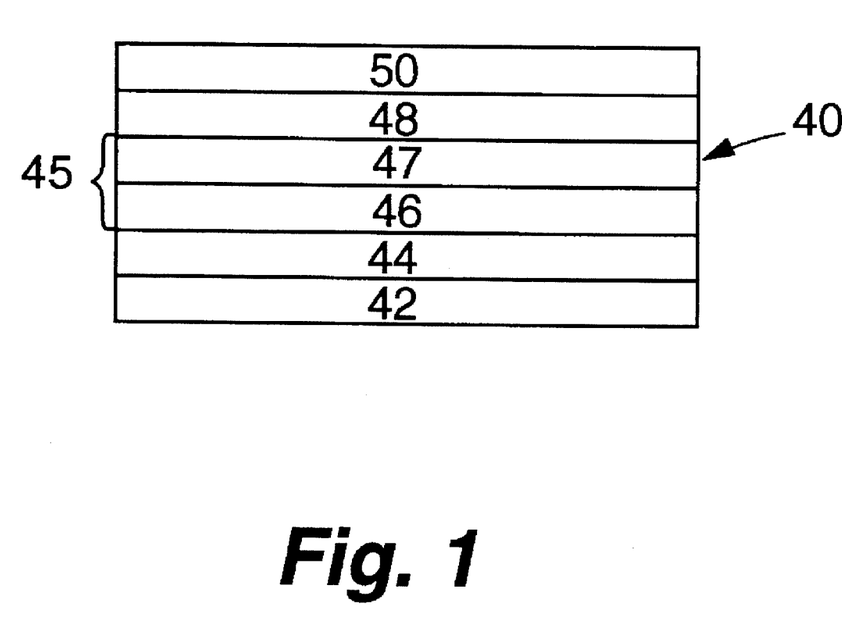
FIG. 1 shows a cross section of a device incorporating the metal oxide on metal composite of the present invention.

The present invention also includes electronic junction devices including ferroelectric materials such as in ferroelectric memory elements. For example, a ferroelectric memory element can include a layer of a ferroelectric material between two electrodes, one electrode of a metal such as platinum and the other electrode being a composite electrode of a thin layer of the conductive alkaline earth metal oxide and a layer of a metal such as platinum. In such a composite electrode, the conductive alkaline earth metal oxide layer is preferably oriented epitaxially and the entire composite electrode can have heteroepitaxial orientation. In FIG. 1, ferroelectric memory element device 10 includes a substrate 12 of, e.g., silicon or gallium arsenate, having thereon an intermediate layer 14 of a material such as yttrium-stabilized zirconia or magnesium oxide as a buffer layer or barrier layer. Upon layer 14 is a composite electrode or electrical contact 15 including a layer 16 of a noble metal such as platinum and a layer 17 of an conductive alkaline earth metal oxide such as $SrRuO_3$. Upon composite electrode 15 is a layer 18 of ferroelectric material such as lead zirconium titanium oxide (PZT) or barium titanium oxide (BTO). Upon layer 18 of ferroelectric material is layer 20 which can be, e.g., a layer of a conductive alkaline earth metal oxide material or a layer of a noble metal such as platinum. In such a ferroelectric memory element device the layer of ferroelectric material such as BTO generally has a thickness from about 1000A up to 10,000A. The layers 16 and 17 of the conductive alkaline earth metal oxide and noble metal layer such as platinum generally have thicknesses from about 500A up to about 20,000A. Layer 20 can be an optically transparent conductive oxide material such as indium-tin oxide (ITO) to form a detector-type device.

Thin films or layers of a conductive alkaline earth metal oxide can be deposited upon the metal film or substrate such as platinum by pulsed laser deposition or by methods such as evaporation including coevaporation, electron-beam evaporation and activated reactive evaporation, sputtering including magnetron sputtering, ion beam sputtering and ion assisted sputtering, cathodic arc deposition, chemical vapor deposition (CVD), organometallic chemical vapor deposition (OMCVD), plasma enhanced chemical vapor deposition (PECVD), molecular beam epitaxy (MBE) or a sol-gel process. Pulsed laser deposition is preferred as the deposition method.

The metal substrate can be the metal alone or can be a thin film or layer of the metal upon an underlying substrate of another material. For example, thin films or layers of a noble metal such as platinum, gold or silver can be deposited upon substrates of, e.g., lanthanum aluminum oxide, strontium titanium oxide, magnesium oxide, neodymium gadolinium oxide, yttria-stabilized zirconium or aluminum oxide (sapphire), preferably magnesium oxide, by pulsed laser deposition or by methods such as evaporation including coevaporation, electron-beam evaporation and activated reactive evaporation, sputtering including magnetron sputtering, ion beam sputtering and ion assisted sputtering, cathodic arc deposition, chemical vapor deposition (CVD), organometallic chemical vapor deposition (OMCVD), plasma enhanced chemical vapor deposition (PECVD), molecular beam epitaxy (MBE) or a sol-gel process to form what is referred to as a platinum substrate. Pulsed laser deposition is preferred as the deposition method. For certain applications, the substrate preferably has an crystalline orientation such as (100) orientation.

In pulsed laser deposition of the conductive alkaline earth metal oxide, powder of the desired material, e.g., strontium ruthenium oxide, can be initially pressed into a disk or pellet under high pressure, generally above about 1000 pounds per square inch (PSI) and the pressed disk then sintered in an oxygen-containing atmosphere for at least about 1 hour, preferably for from about 12 to about 24 hours. An apparatus suitable for the pulsed laser deposition is shown in Appl. Phys. Lett., 56, 578 (1990), "Effects of beam parameters on excimer laser deposition of $YBa_2Cu_3O_{7-x}$", such description hereby incorporated by reference.

Suitable conditions for pulsed laser deposition include, e.g., the laser, such as a XeCl excimer laser (20 nanoseconds (ns), 308 nanometers (nm)), targeted upon a rotating pellet of the desired material at an incident angle of about 45°. The target substrate can be mounted upon a heated holder rotated at about 0.5 rpm to minimize thickness variations in the resultant film. The substrate can be heated during the deposition at temperatures from about 600° C. to about 950° C., preferably from about 700° C. to about 850° C. An oxygen atmosphere of from about 0.1 millitorr (mTorr) to about 10 Torr, preferably from about 100 mTorr to about 250 mTorr, can be maintained within the deposition chamber during the deposition. Distance between the substrate holder and the pellet can be from about 4 centimeters (cm) to about 10 cm.

The rate of formation of the deposited film can be varied from about 0.1 Angstrom per second (A/s) to about 200 A/s by changing the laser repetition rate from about 1 hertz (Hz) to about 200 Hz. As laser beam divergence is a function of the repetition rate, the beam profile can be monitored after any change of repetition rate and the lens focal distance adjusted to maintain a constant laser energy density upon the target pellet. Generally, the laser beam can have dimensions of about 3 millimeters (mm) by 4 mm with an average energy density from about 1 to about 5 joules per square centimeter ($J/cm_2$), preferably from about 1.5 to about 3 $J/cm^2$. After deposition the deposited films are generally cooled to about 200° within an oxygen atmosphere of greater than about 100 Torr for about 15 to about 30 minutes.

The present invention is more particularly described in the following examples which are intended as illustrative only, since numerous modifications and variations will be apparent to those skilled in the art.

EXAMPLE A

A $SrRuO_3$ target was initially fabricated for subsequent thin film deposition by mixing appropriate molar ratios of $SrCO_3$ and ruthenium metal powders, e.g., 7.27 grams (g) of $SrCO_3$ powder and 10 g of ruthenium metal powder, grinding the mix of powders, and heating in air at about 1200° C. for about 12 hours. A second cycle of grinding and heating yielded a dark blue powder of a single phase $SrRuO_3$ as revealed by x-ray diffraction. The resultant powder was pressed into disks of 2.5 centimeters (cm) in diameter and sintered at from about 1250° C. to about 1350° C. for about 24 hours to obtain targets having good mechanical properties.

EXAMPLE 1

Thin films of platinum were deposited upon base substrates of (100) MgO from platinum foils (99.999% pure) using pulsed laser deposition at 725° C. in a vacuum of about $10^{-5}$ Torr. The set-up for the pulsed laser deposition was as described in Appl. Phys. Lett., 56, 1481 (1990) and in Appl. Phys. Lett., 56, 578 (1990) and employed an XeCl excimer laser. The average laser energy density was from about 1.5 Joules per square centimeter ($J/cm^2$) to about 3 $J/cm^2$. The MgO substrates were initially cleaned using acetone and methanol sequentially. The resultant platinum films upon the MgO substrates were about 500A in thickness as determined by Rutherford Backscattering Spectroscopy and surface profilometry. Upon the thin films of platinum, thin films of $SrRuO_3$ were then deposited using pulsed laser deposition from the disks prepared in Example A. Oxygen pressure during the $SrRuO_3$ deposition was about 200 milliTorr and the substrates were heated at temperatures of about 750° C.

Figure 2:
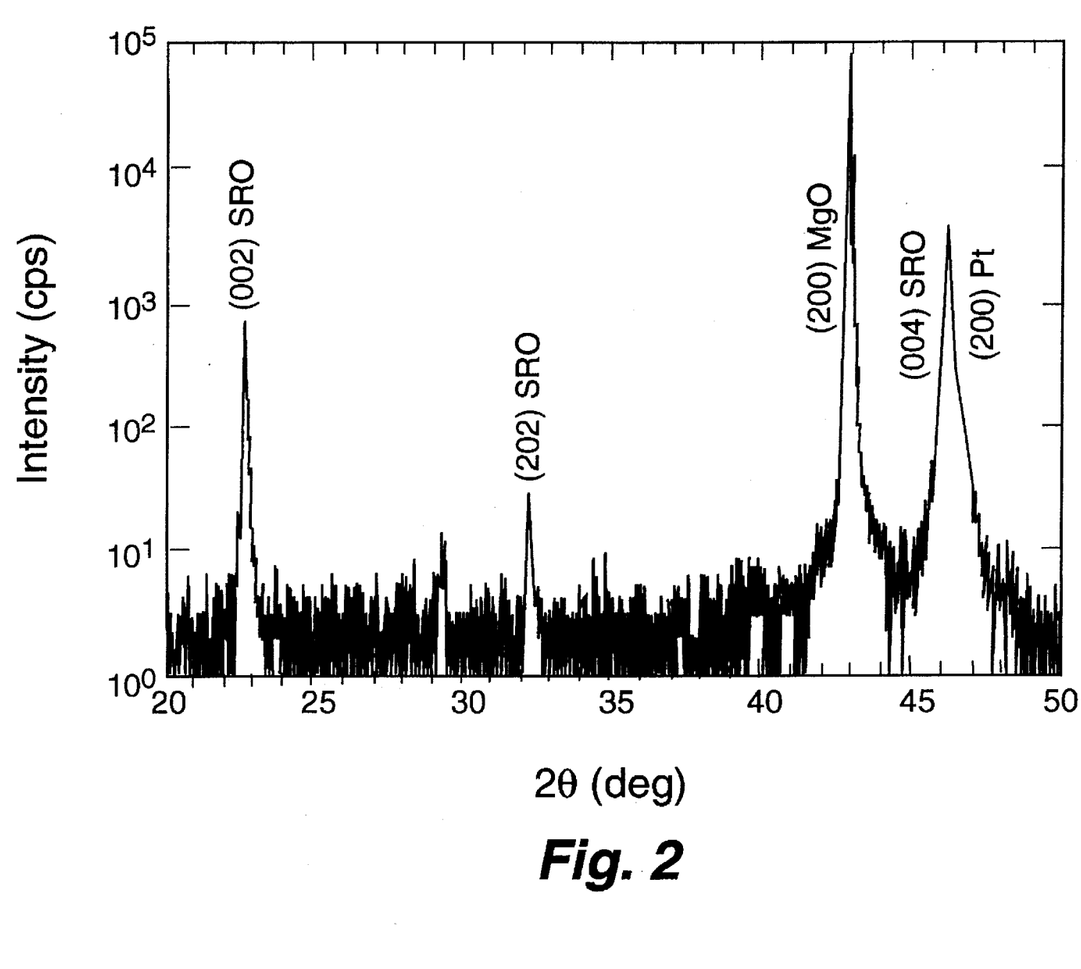
FIG. 2 is a graph plotting an X-ray θ–2θ scan for a strontium-ruthenium oxide/platinum multilayer structure on (100) magnesium oxide.
Figure 3:
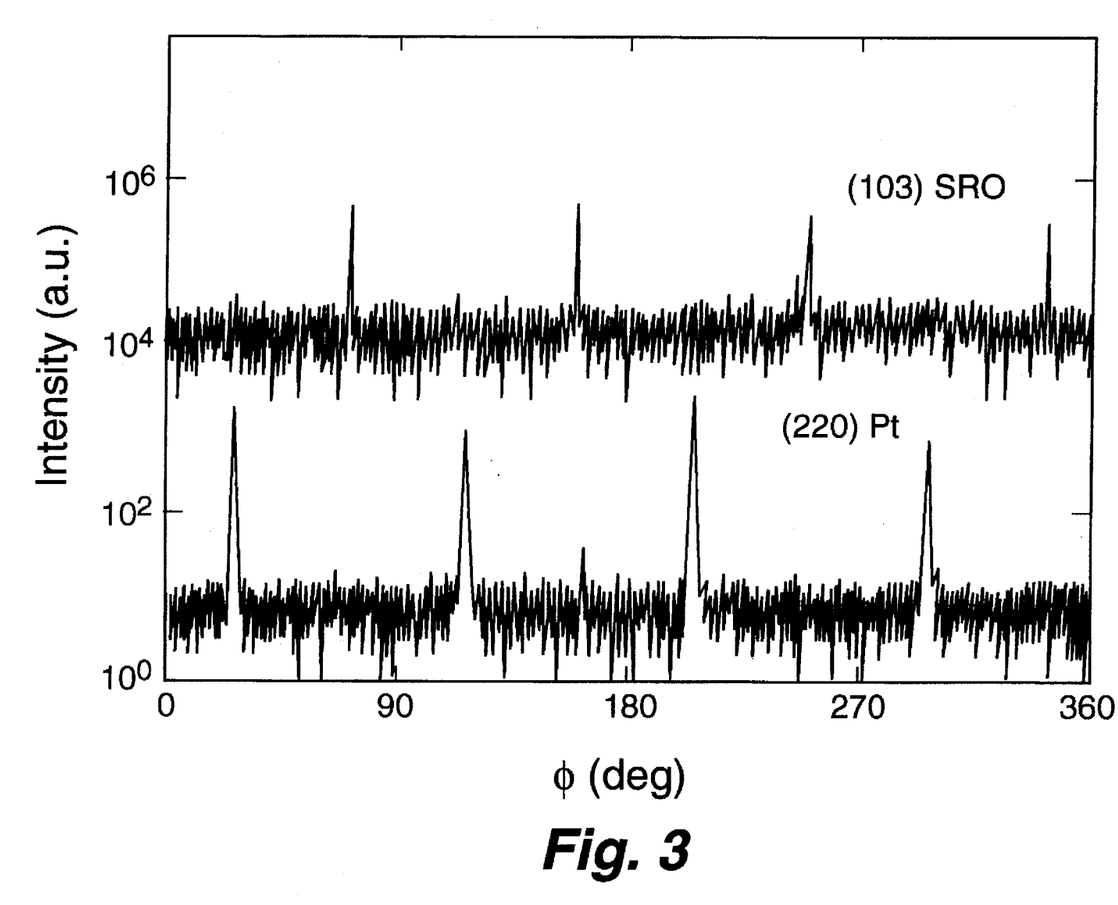
FIG. 3 is a graph plotting an x-ray Φ-scan for a strontium-ruthenium oxide/platinum/magnesium oxide heteroepitaxial structure taken at (103) strontium-ruthenium oxide and (220) platinum reflections.
Figure 4:
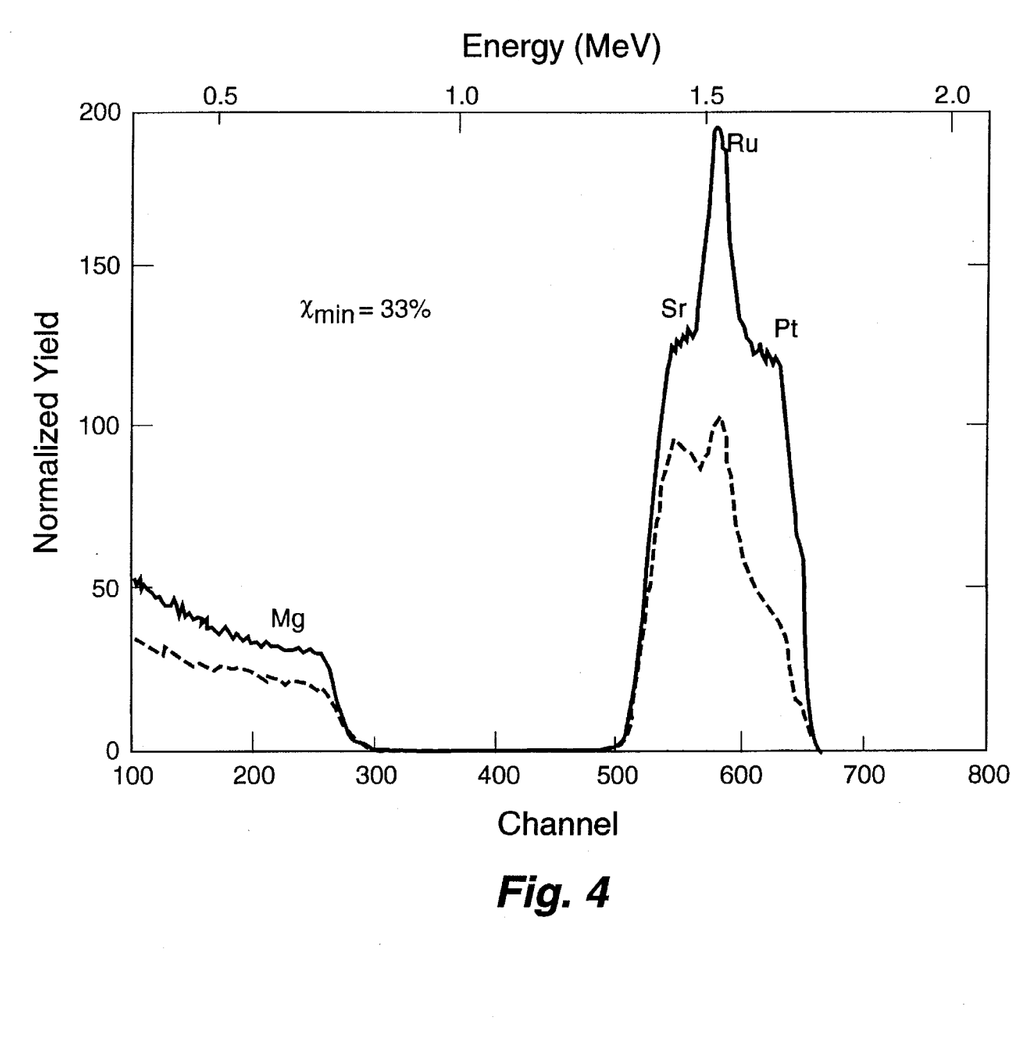
FIG. 4 is a graph plotting the Rutherford Backscattering Spectroscopy for a strontium-ruthenium oxide film on platinum/magnesium oxide.

The resultant films were characterized by x-ray diffraction (both θ–2θ and in-plane Φ scans), four-point probe resistivity, Rutherford backscattering spectrometry (RBS), and high-resolution transmission electron microscopy. FIG. 2 shows the θ–2θ x-ray scan of the $SrRuO_3$/Pt/MgO multilayer structure using Cu Kα radiation. The results indicate that the $SrRuO_3$ film has predominantly c-axis oriented material, oriented normal, i.e., a (002) orientation, to the substrate surface, with a small percentage of less than about 0.5 percent (202) $SrRuO_3$ oriented grains. The in-plane epitaxy of (001) oriented $SrRuO_3$ and Pt layers was determined by using a x-ray Φ-scan. The results are shown in FIG. 3 wherein excellent in-plane epitaxy is indicated by the four peaks 90° apart but with a 45° rotation in-plane between the $SrRuO_3$ film and the platinum lattice. RBS (with 2.2 MeV $He^+$) was used in the channeling mode to determine the crystallinity of the $SrRuO_3$ film. FIG. 4 shows the random and aligned spectra for the $SrRuO_3$ film deposited upon a platinum/MgO composite substrate. An ion beam minimum yield (χmin) of 33% was obtained for the ruthenium, indicating good crystallinity in the film. Essentially stoichiometric films were obtained under the present processing conditions. Resistivity measurements on the 500 A thick platinum layer on the MgO yielded about 18 μΩ-cm at room temperature. Resistivity measurements on the $SrRuO_3$ film yielded about 44 μΩ-cm at room temperature. In comparison the resistivity of such an oxide grown directly upon MgO has been previously found to be higher by a factor of from about 3 to 4. Placing the platinum layer between the conductive alkaline earth metal oxide layer and the MgO effectively shorts the current path and reduces the overall resistivity of the total structure. TEM studies of the interface between the conductive alkaline earth metal oxide layer and the platinum showed a smooth interface and no apparent interdiffusion.

EXAMPLE 2

Thin films of platinum were deposited upon base substrates of (100) MgO from platinum foils (99.999% pure) using pulsed laser deposition at 725° C. in a vacuum of about $10^{-5}$ Torr. The set-up for the pulsed laser deposition was as described in Appl. Phys. Lett., 56, 1481(1990) and in Appl. Phys. Lett., 56, 578(1990) and employed an XeCl excimer laser. The average laser energy density was from about 1.5 Joules per square centimeter ($J/cm^2$) to about 3 $J/cm^2$. The MgO substrates were initially cleaned using acetone and methanol sequentially. The resultant platinum films upon the MgO substrates were about 500A in thickness as determined by Rutherford Backscattering Spectroscopy and surface profilometry. Upon the thin films of platinum, thin films of $La_{0.5}Sr_{0.5}CoO_3$ (available from Target Materials of Ohio) were then deposited using pulsed laser deposition. Oxygen pressure during the $La_{0.5}Sr_{0.5}CoO_3$ deposition was about 200 milliTorr and the substrates were heated at temperatures of about 700° C.

The resultant films were characterized by x-ray diffraction (both θ–2θ and in-plane Φ scans), four-point probe resistivity, Rutherford backscattering spectrometry (RBS), and high-resolution transmission electron microscopy.

Figure 5:
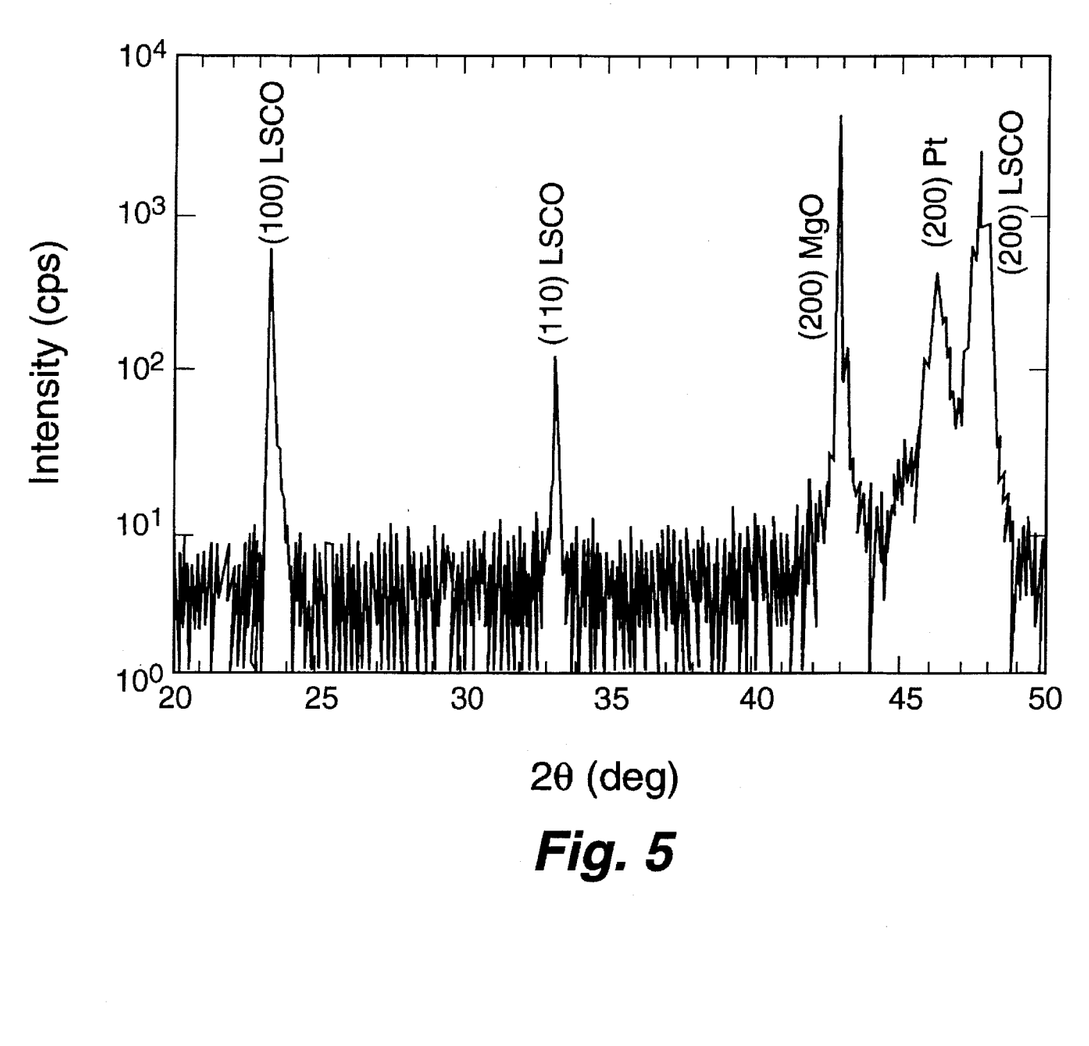
FIG. 5 is a graph plotting an X-ray θ–2θ scan for a lanthanum-strontium cobalt oxide/platinum multilayer structure on (100) magnesium oxide.
Figure 6:
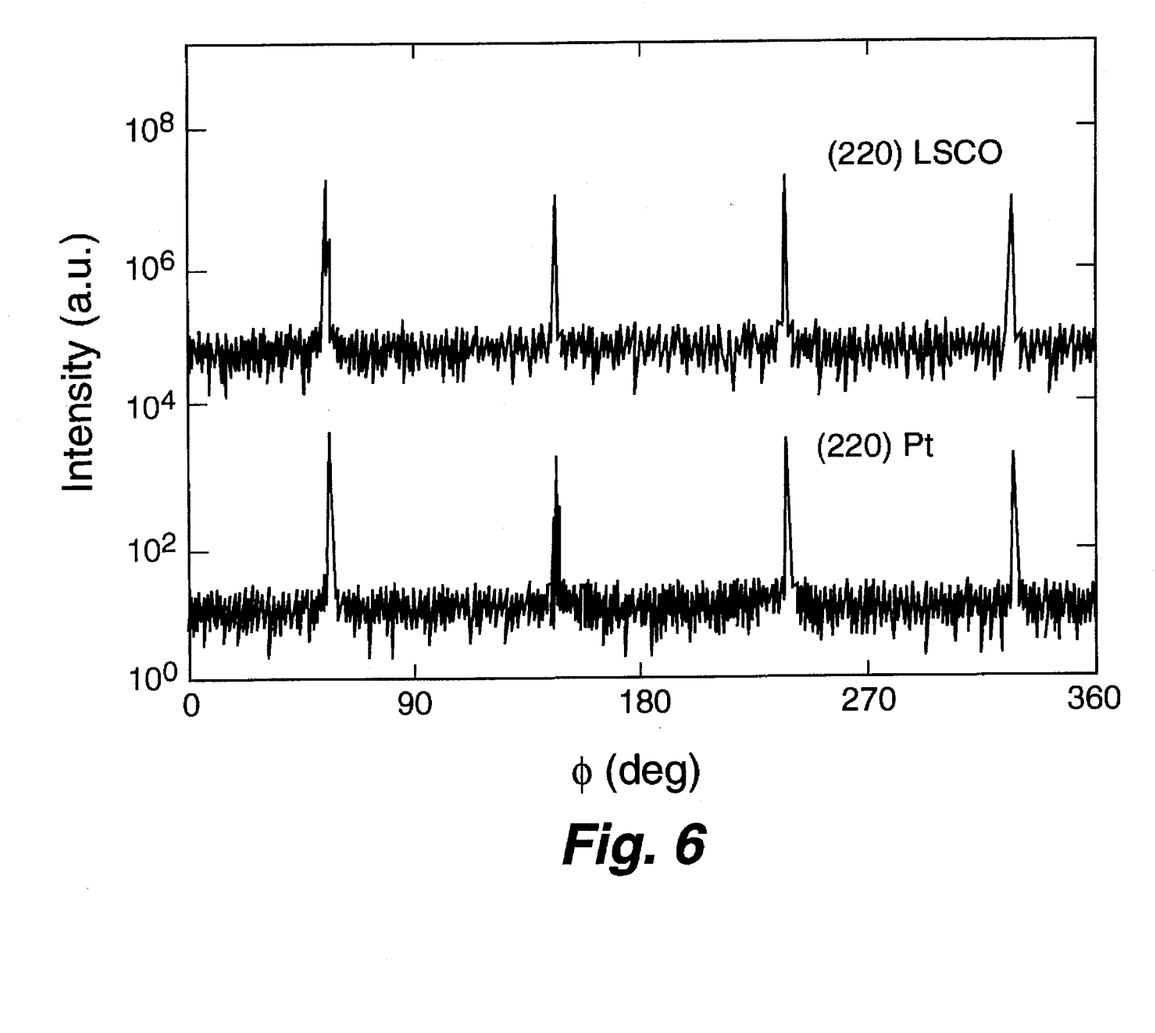
FIG. 6 is a graph plotting an x-ray Φ-scan for a lanthanum-strontium cobalt oxide/platinum/magnesium oxide heteroepitaxial structure taken at (220) lanthanum-strontium cobalt oxide and (220) platinum reflections.
Figure 7:
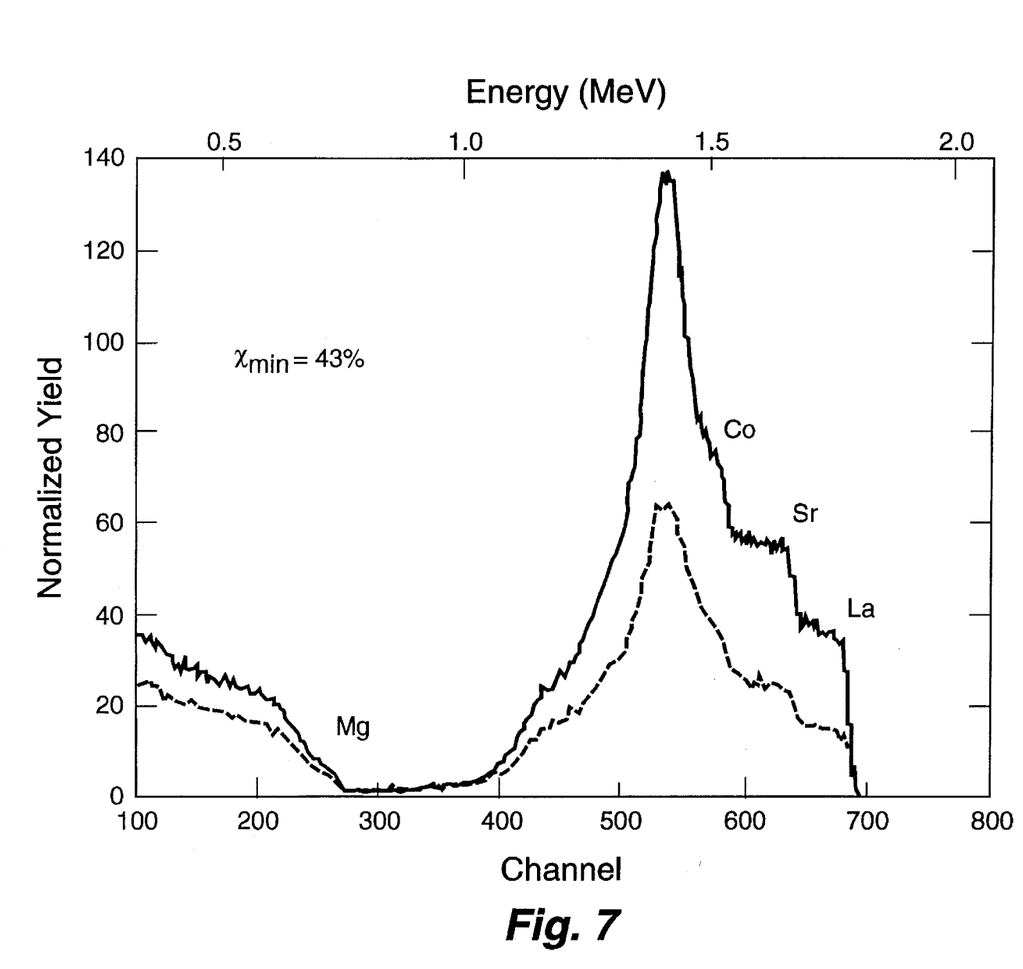
FIG. 7 is a graph plotting the Rutherford Backscattering Spectroscopy for a lanthanum-strontium cobalt oxide film on platinum/magnesium oxide.

FIG. 5 shows the θ–2θ x-ray scan of the $La_{0.5}Sr_{0.5}CoO_3$/Pt/MgO multilayer structure using Cu Kα radiation. The results indicate that the $La_{0.5}Sr_{0.5}CoO_3$ film has predominantly (001) and (002) oriented material, with a small percentage of less than about 2 percent (110) oriented grains. The in-plane epitaxy of $La_{0.5}Sr_{0.5}CoO_3$ and Pt layers was determined by using a x-ray Φ-scan. The results are shown in FIG. 6 wherein excellent in-plane epitaxy is indicated by the four peaks 90° apart and aligned at the same angle indicating a close lattice match between the $La_{0.5}Sr_{0.5}CoO_3$ and Pt layers. RBS (with 2.2 MeV $He^+$) was used in the channeling mode to determine the crystallinity of the $La_{0.5}Sr_{0.5}CoO_3$ film. FIG. 7 shows the random and aligned spectra for the $La_{0.5}Sr_{0.5}CoO_3$ film deposited upon a platinum/MgO composite substrate. An ion beam minimum yield ($\chi_{min}$) of 43% was obtained for the ruthenium, indicating good crystallinity in the film although with a large defect density. Resistivity measurements on the $La_{0.5}Sr_{0.5}CoO_3$ film yielded about 35 μΩ-cm at room temperature. Placing the platinum layer between the conductive alkaline earth metal oxide layer and the MgO effectively shorts the current path and reduces the overall resistivity of the total structure. TEM studies of the interface between the conductive alkaline earth metal oxide layer and the platinum showed a smooth interface and no apparent interdiffusion.

EXAMPLE 3

Thin films of platinum were deposited upon base substrates of (100) MgO from platinum foils (99.999% pure) using pulsed laser deposition at 725° C. in a vacuum of about $10^{-5}$ Torr. The set-up for the pulsed laser deposition was as described in Appl. Phys. Lett., 56, 1481(1990) and in Appl. Phys. Lett., 56, 578(1990) and employed an XeCl excimer laser. The average laser energy density was from about 1.5 Joules per square centimeter ($J/cm^2$) to about 3 $J/cm^2$. The MgO substrates were initially cleaned using acetone and methanol sequentially. The resultant platinum films upon the MgO substrates were about 500 A in thickness as determined by Rutherford Backscattering Spectroscopy and surface profilometry.

Upon the thin films of platinum, thin films of $SrRuO_3$ were then deposited using pulsed laser deposition from the disks prepared in Example A. Oxygen pressure during the $SrRuO_3$ deposition was about 200 milliTorr and the substrates were heated at temperatures of about 750° C. The resultant films of $SrRuO_3$ upon the platinum layers were about 200 nanometers.

Upon the thin film layers of $SrRuO_3$, thin films of YBaCuO were then deposited using pulsed laser deposition. Oxygen pressure during the YBaCuO deposition was about 200 milliTorr and the substrates were heated at temperatures of about 750° C. The resultant films of YBaCuO upon the $SrRuO_3$ layers were about 150 nanometers.

The resultant films were characterized by x-ray diffraction (both $\theta$–$2\theta$ and in-plane $\Phi$ scans) and Rutherford backscattering spectrometry (RBS). Superconducting transition temperatures of the YBaCuO films were measured by an inductive method analogous to the method described in U.S. Pat. No. 5,134,360 and the critical current densities were measured by a direct transport method.

Figure 8:
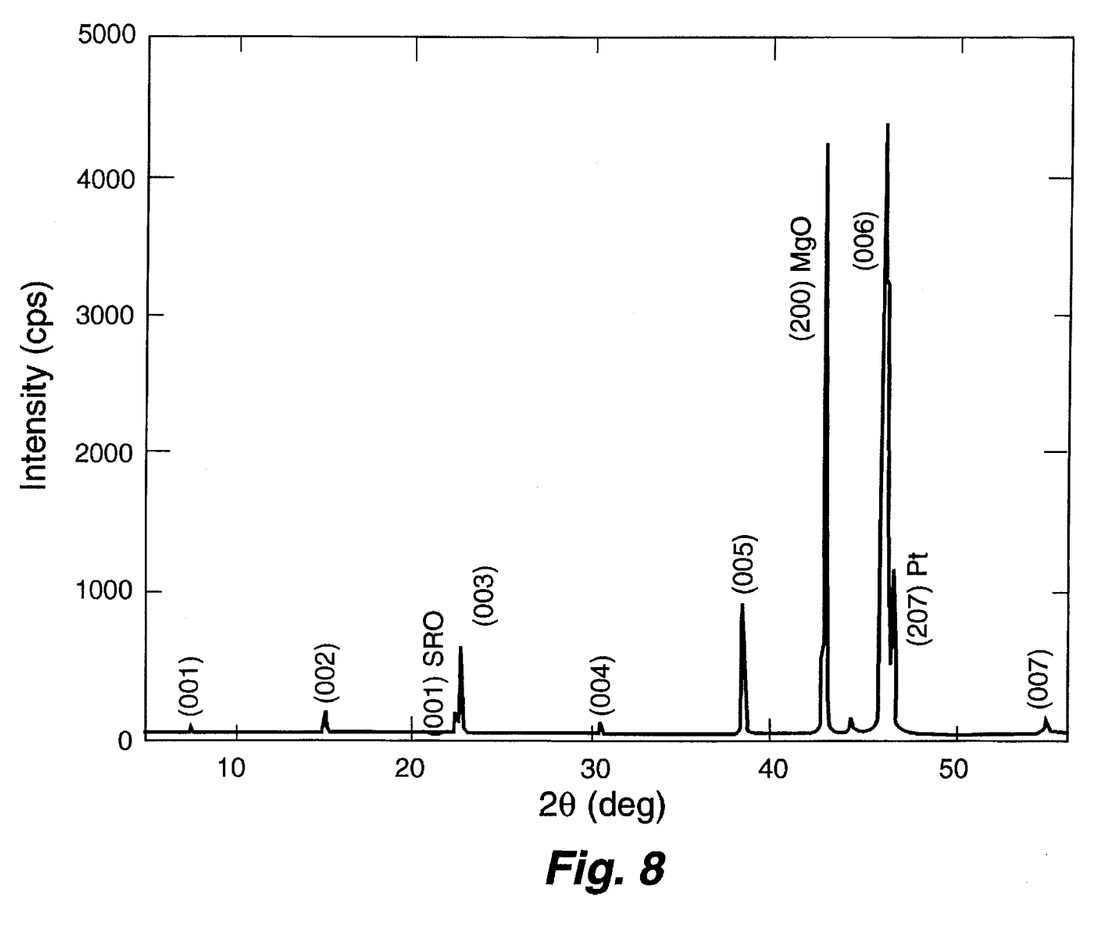
FIG. 8 is graph plotting an X-ray θ–2θ scan for a yttrium-barium-copper oxide/strontium ruthenium oxide/platinum multilayer structure on (100) magnesium oxide.
Figure 9:
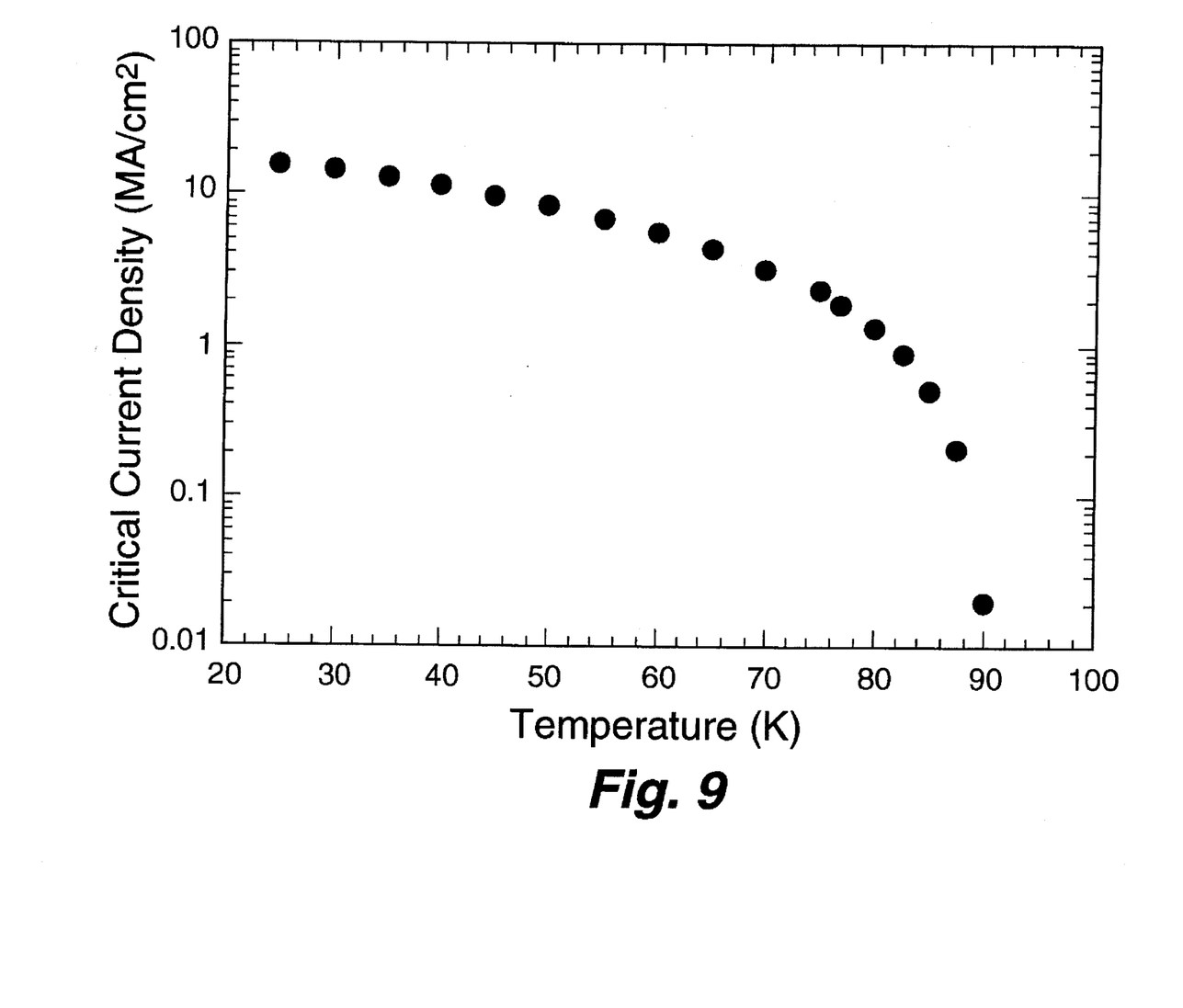
FIG. 9 is a graph plotting a critical current density measurement for a yttrium-barium-copper oxide/strontium ruthenium oxide/platinum/magnesium oxide multilayer as a function of temperature using a four point probe transport technique.

FIG. 8 shows the $\theta$–$2\theta$ x-ray scan of the YBCO/$SrRuO_3$/Pt/MgO multilayer structure using Cu K$\alpha$ radiation. The results clearly indicate that the YBCO film has a c-axis textured orientation. Additionally, (001) $SrRuO_3$ and (200) Pt peaks are present. In-plane epitaxy of YBCO layer was determined using a x-ray $\Phi$-scan with the results showing excellent in-plane epitaxy as indicated by four peaks 90° apart. RBS (with 2.2 MeV He$^+$) was used in the channeling mode to determine the crystallinity of the YBCO film with an ion beam minimum yield ($\chi_{min}$) of 16% obtained for the barium, indicating good crystallinity in the film. FIG. 9 shows the critical current $J_c$ plotted as a function of temperature. At 77K, the $J_c$ was found to be about $2.0\times10^6$ A/cm$^2$ and a value of $1.4\times10^7$ A/cm$^2$ was found at 25K.

Although the present invention has been described with reference to specific details, it is not intended that such details should be regarded as limitations upon the scope of the invention, except as and to the extent that they are included in the accompanying claims.

What is claimed is:

1. A heteroepitaxial oriented structure comprising a thin film of an epitaxial oriented conductive alkaline earth metal oxide selected from the group consisting of strontium ruthenium oxide, calcium ruthenium oxide, barium ruthenium oxide, lanthanum-strontium cobalt oxide or mixed alkaline earth ruthenium trioxides thereof, epitaxially oriented upon a thin film of a noble metal.

2. The heteroepitaxial oriented structure of claim 1 wherein the epitaxial oriented conductive alkaline earth metal oxide is strontium ruthenium trioxide.

3. The heteroepitaxial oriented structure of claim 1 wherein the epitaxial oriented conductive alkaline earth metal oxide is lanthanum-strontium cobalt trioxide.

4. The heteroepitaxial oriented structure of claim 1 wherein said thin film of epitaxial oriented conductive alkaline earth metal oxide is from about 100 Angstroms to about 10,000 Angstroms in thickness.

\* \* \* \* \*